United States Patent
Winzeler et al.

(10) Patent No.: US 9,874,486 B2
(45) Date of Patent: Jan. 23, 2018

(54) METHODS AND APPARATUS FOR PACKAGING A MEMS DEVICE

(71) Applicant: DunAn Sensing, LLC, San Jose, CA (US)

(72) Inventors: Gary Winzeler, Morgan Hill, CA (US); Danny Do, San Jose, CA (US); Cuong D. Nguyen, San Jose, CA (US); Emir Vukotic, San Jose, CA (US)

(73) Assignee: DUNAN SENSING, LLC, San Jose, CA (US)

( * ) Notice: Subject to any disclaimer, the term of this patent is extended or adjusted under 35 U.S.C. 154(b) by 206 days.

(21) Appl. No.: 14/988,553

(22) Filed: Jan. 5, 2016

(65) Prior Publication Data

US 2017/0191892 A1    Jul. 6, 2017

(51) Int. Cl.
| | |
|---|---|
| *G01L 7/08* | (2006.01) |
| *G01L 7/00* | (2006.01) |
| *H05K 5/06* | (2006.01) |
| *H05K 5/00* | (2006.01) |
| *G01D 11/24* | (2006.01) |
| *G01L 19/00* | (2006.01) |

(52) U.S. Cl.
CPC .............. *G01L 7/08* (2013.01); *G01D 11/245* (2013.01); *G01L 19/0007* (2013.01); *G01L 19/0084* (2013.01); *H05K 5/0095* (2013.01); *H05K 5/069* (2013.01)

(58) Field of Classification Search
None
See application file for complete search history.

(56) References Cited

U.S. PATENT DOCUMENTS

| 6,845,664 | B1 * | 1/2005 | Okojie .................. | B81B 7/0061 |
|---|---|---|---|---|
| | | | | 257/433 |
| 2010/0207217 | A1 * | 8/2010 | Zuniga-Ortiz ........ | B81C 1/0023 |
| | | | | 257/415 |
| 2012/0270354 | A1 * | 10/2012 | Hooper ................. | G01L 19/141 |
| | | | | 438/51 |
| 2017/0190570 | A1 * | 7/2017 | Kwa ..................... | B81B 7/0035 |

* cited by examiner

*Primary Examiner* — Andre Allen
(74) *Attorney, Agent, or Firm* — Hackler Daghighian Martino & Novak

(57) ABSTRACT

Systems and methods for packaging a MEMS device are provided. Embodiments herein avoid the use of a metal housing enclosing the MEMS device or die pad of the MEMS device. Instead, a metal port is mounted directly to the MEMS device using a ceramic carrier. In preferred embodiments, the ceramic carrier is soldered, brazed, welded or eutectic bonded to the metal port.

21 Claims, 2 Drawing Sheets

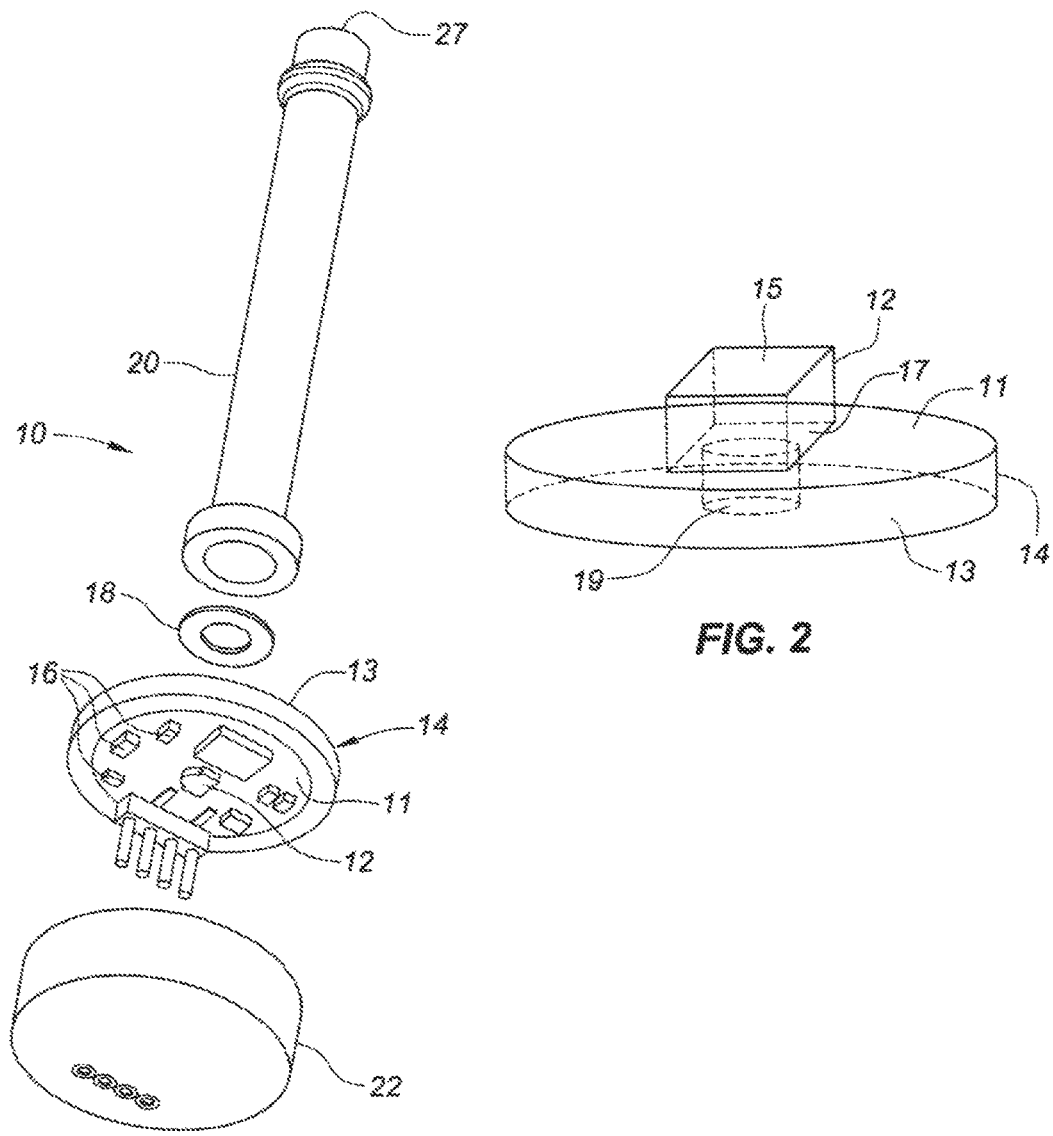

METHODS AND APPARATUS FOR PACKAGING A MEMS DEVICE

TECHNICAL FIELD

The present patent document relates to methods and apparatus for packaging microelectromechanical systems (MEMS). More particularly, the present patent document relates to methods and apparatus for directly mounting a metal tube to a MEMS sensor without the use of a metal housing.

BACKGROUND

Typical MEMS packaging systems mount a MEMS device to a die pad and the die pad is then hermetically sealed to a metal housing. In applications where the sensor is exposed to harsh environments, such as refrigeration and AC systems, a backside entry sensor is used because the top side of the sensor, which usually contains the piezo-resistive elements and connections to the package, cannot be exposed to the harsh conditions in the environment. The MEMS device is typically mounted on a die pad that provides a flange for mounting to the metal housing. The die pad includes a channel or port to the back side of the MEMS device. The flange of the die pad is then hermetically sealed to the metal housing. The metal housing surrounds the die pad and hermetically seals the channel or port of the die pad with a channel or port of the metal housing. The channel or port of the metal housing typically leads to an interface, such as a threaded interface, that allows the MEMS device to be coupled to a larger system. To this end, the die pad and metal housing combine to provide a hermetically sealed channel or port from the larger system to the back side of the MEMS device.

Typical MEMS systems including a die pad and metal housing have a number of deficiencies. For example, a number of different hermetically sealed interfaces must be executed and executed without defects. The MEMS device must be hermetically sealed to the die pad and the die pad must then be hermetically sealed to the metal housing. Each one of these seals must be maintained leak free for the life of the system.

In addition, because the MEMS device, die pad, and housing are usually made of different materials, the seals may be subject to thermal mismatch, which can cause cyclical stresses under thermal loading. Over time, the cyclical stresses due to thermal loading can affect the integrity of the seals. For all these reasons, the manufacture of MEMS systems with the typical construction discussed above may be complicated and include complex processes. These complex processes can lead to increased costs.

It would be beneficial if MEMS packaging designs could be simplified and some of the issues addressed above could be eliminated or ameliorated.

SUMMARY OF THE EMBODIMENTS

In view of the foregoing, an object according to one aspect of the present patent document is to provide MEMS systems and methods for packaging MEMS devices. Preferably, the methods and apparatus address, or at least ameliorate one or more of the problems described above. To this end, a MEMS system is provided. In one embodiment, the MEMS system comprises: a MEMS device including a front side and a backside; a ceramic substrate with an opening that traverses the ceramic substrate wherein the backside of the MEMS device is hermetically sealed to a first side of the ceramic substrate around the opening; and, a metal port aligned with the opening and hermetically sealed to the ceramic substrate around the opening on an opposite side of the ceramic substrate from the MEMS device; wherein the metal port is not formed in a metal housing that surrounds the ceramic substrate.

The MEMS device may be any type of device but is preferably a pressure sensor. If the MEMS device is a pressure sensor, the pressure sensor may include a diaphragm exposed to the opposite side of the ceramic substrate through the opening.

In some embodiments, the metal port is a tube. In some of those embodiments, the tube is copper.

In some embodiments, the MEMS system further comprises a non-metallic housing that couples to the ceramic substrate on the first side of the ceramic substrate and encloses the MEMS device on the first side of the ceramic substrate. Preferably, the non-metallic housing is made from ceramic.

In some embodiments, the MEMS system further comprises signal conditioning circuitry for the MEMS device wherein the signal conditioning circuitry is mounted on the first side of the ceramic substrate. In some of those embodiments, the non-metallic housing also encloses signal conditioning circuitry for the MEMS device mounted on the first side of the ceramic substrate.

In order to attach the metal port to the ceramic substrate, some embodiments further comprise a metallic layer deposited around the opening on the opposite side of the ceramic substrate between the ceramic substrate and the metal port, the metallic layer designed to allow the metal port to be soldered to the substrate.

In another embodiment, a MEMS system is provided that comprises: a MEMS device including a front side and a backside; a ceramic substrate with an opening that traverses the ceramic substrate wherein the backside of the MEMS device is hermetically sealed to a first side of the ceramic substrate around the opening; and, a non-metallic housing that couples to the ceramic substrate on the first side and encloses the MEMS device on the first side of the ceramic substrate.

In such embodiments, the MEMS system ay further comprise a metal port aligned with the opening and hermetically sealed to the ceramic substrate around the opening on an opposite side of the ceramic substrate from the MEMS device. The metal port is not formed in a metal housing that surrounds the ceramic substrate.

In another aspect of the disclosure provided herein, a method of packaging a MEMS device is provided. The method comprises: hermetically sealing a MEMS device around an opening in a ceramic substrate on a first side of the ceramic substrate wherein a backside of the MEMS device is exposed to an opposite side of the ceramic substrate through the opening; mounting signal conditioning electronics for the MEMS device on the first side of the ceramic substrate; enclosing the MEMS device and signal conditioning electronics on the first side of the ceramic substrate with a non-metallic housing; depositing a layer of metallic paste around the opening on the opposite side of the ceramic substrate; and, hermetically sealing a metal port to the ceramic substrate by soldering the metal port to the metallic layer wherein the metal port is not formed as part of a metal housing that surrounds the ceramic substrate.

In preferred embodiments, the metal port is a metal tube with an outside diameter less than an outside diameter of the ceramic substrate. In some embodiments, the metal tube is a copper tube.

In preferred embodiments, the depositing step of the method of packaging a MEMS device is performed by screen printing the metallic paste around the opening.

In another embodiment of a method of packaging a MEMS device, the method comprises: hermetically sealing a MEMS sensor around an opening in a ceramic substrate on a first side of the ceramic substrate wherein a backside of the MEMS device is exposed to an opposite side of the ceramic substrate through the opening; hermetically sealing a metal tube to the opposite side of the ceramic substrate over the opening wherein the ceramic substrate has an outside diameter at least twice the outside diameter of the metal tube Further aspects, objects, desirable features, and advantages of the apparatus and methods for packaging a MEMS device disclosed herein will be better understood from the detailed description and drawings that follow in which various embodiments are illustrated by way of example. It is to be expressly understood, however, that the drawings are for the purpose of illustration only and are not intended as a definition of the limits of the claimed invention.

BRIEF DESCRIPTION OF THE DRAWINGS

FIG. 1 illustrates an exploded view of a MEMS system accordingly to at least one embodiment of the present patent document;

FIG. 2 illustrates a wireframe view of just the MEMS device coupled to the substrate;

DETAILED DESCRIPTION OF THE EMBODIMENTS

Figure 3:
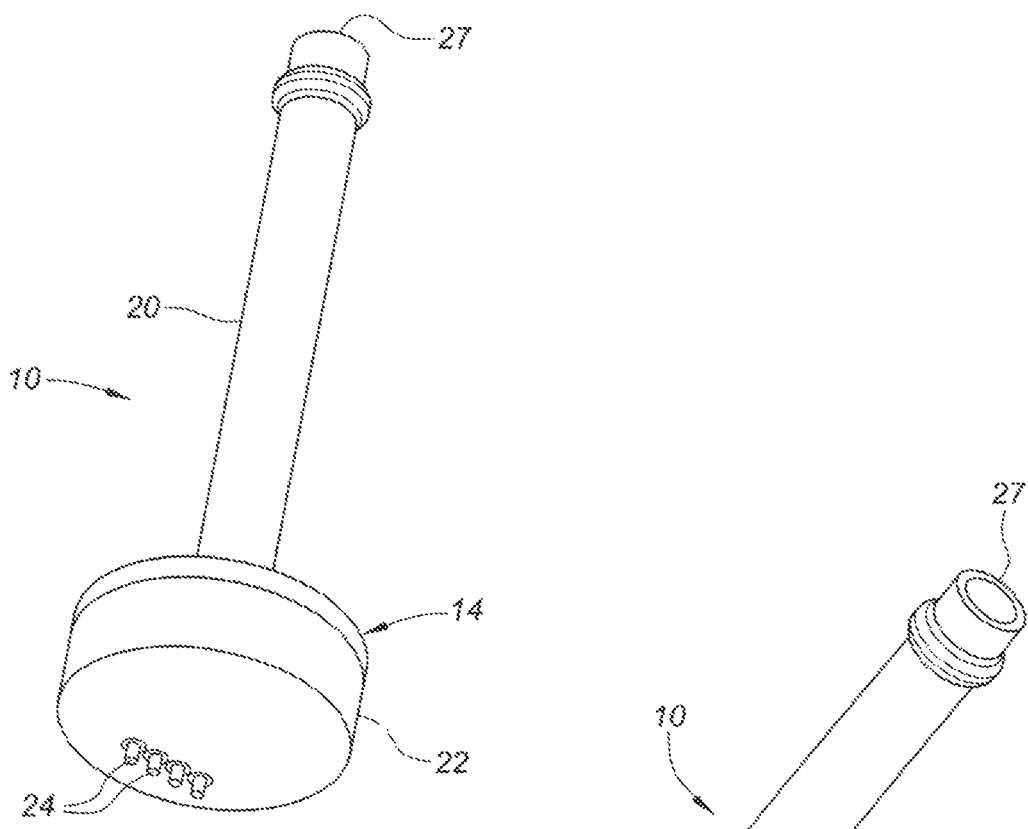
FIG. 3 illustrates an assembled view of the MEMS system shown in FIG. 1.

FIG. 1 illustrates an exploded view of a MEMS system 10 accordingly to at least one embodiment of the present patent document. The embodiment shown in FIG. 1 includes a MEMS device 12, a substrate 14, electronics 16, a port 20, and a housing 22. In other embodiments, more or fewer components may be present. Embodiments of the present invention eliminate the metal housing of typical designs. Instead, the MEMS device 12 is mated directly to the metal port 20 using a ceramic carrier 14. Preferably, the ceramic carrier 14 is soldered, brazed, welded or eutectic bonded to the metal port 20. Accordingly, the embodiments described herein reduce the mass of the MEMS system 10, reduce the number of hermetic seals in the MEMS system 10, and reduce the costs of production by at least the cost of the metal housing.

In the embodiments described herein, the MEMS device 12 may be any type of MEMS device. Preferably the MEMS device 12 is a sensor and even more preferably, the MEMS device is a pressure sensor. In some embodiments where the MEMS device is a pressure sensor, the pressure sensor may include a diaphragm.

FIG. 2 illustrates a wireframe view of just the MEMS device 12 coupled to the substrate 14. The MEMS device 12 has a plurality of sides. For example, the MEMS device has a front-side 15 and a back-side 17 opposite the front-side 15. In this particular case, the back-side 17 is defined by the side of the MEMS that couples to the first side 11 of the substrate 14. The front-side 15 is the side opposite to the back-side 17. In embodiments where the MEMS device 12 is a sensor designed to be subjected to harsh environments, the back-side 17 may be designed to be exposed to such harsh environments through an opening 19 in the substrate 14. In some embodiments, the back-side 17 of the MEMS device 12 may include a diaphragm that is exposed to the harsh environment through the opening 19. The rest of the MEMS device 12 is isolated from the harsh environment by a hermetic seal that surrounds the opening 19 between the MEMS device 12 and the substrate 14.

As may be seen in FIG. 2, the substrate 14 may have an opening 19 that traverses the ceramic substrate 14 from the first side 11 to the opposite side 13 of the substrate 14. The opening 19 may be any size or shape and located anywhere on the substrate 14. Preferably, the opening 19 is sized and placed such that the back-side 17 of the MEMS device 12 may be hermetically sealed to the first side 11 of the substrate 14 around the opening 19.

The substrate 14 may be made from any type of material. In preferred embodiments, the substrate 14 is not metallic. In even more preferred embodiments, the substrate 14 is ceramic.

Returning to Fig, 1, the MEMS system 10 may further include a metal port 20. The metal port 20 is aligned with the opening 19 and hermetically sealed to the opposite side 13 of the substrate 14 around the opening 19. In preferred embodiments, the metal port 20 is soldered, brazed, welded or eutectic bonded to the substrate 14. However, in other embodiments, the metal port 20 may he coupled to the substrate 14 using other methods. In some embodiments, the metal port 20 may be even coupled to the substrate 14 with an appropriate adhesive. Once coupled to the substrate, the metal port 20 may provide a metallic interface 27 to a channel or port that extends to the back-side 17 of the MEMS device 12. To this end, a pressure inlet with a metallic interface 27 is provided to the MEMS device 12 without the use of a metallic housing that surrounds or encloses the MEMS device 12.

In preferred embodiments the metal port 20 may be a metal tube. In even more preferred embodiments the metal port 20 may he a copper tube. However, in other embodiments, the metal port 20 may be made from any type of metal including brass, stainless steel, aluminum, titanium or any other type of metal, with or without a threaded end.

Figure 4:
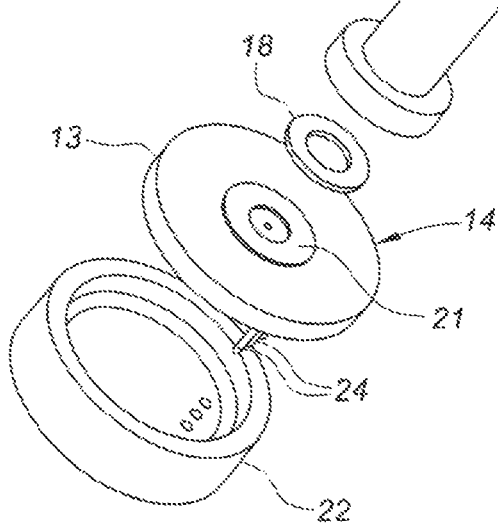
FIG. 4 illustrates an exploded view of the MEMS system shown in FIG. 1 from the opposite side.

Jumping ahead to FIG. 4, in order to couple the metal port 20 to the substrate 14 a solderable interface 21 may be provided. In some embodiments, a layer of metallic paste may be deposited on the side of the substrate 14 designed to interface with the metal port 20. The substrate 14 may be fired with the layer of metallic paste in order to create a solderable interface 21 for the metal port 20. To this end, the metallic paste is preferably deposited around the opening 19. In some embodiments, the metallic paste may be deposited using screen printing. Although the metallic paste may be made from many different substances, it is preferably a type of silver paste. In order to make soldering the metal port 20 to the substrate easier, a solder preform 18 may be used.

As may be seen by returning to FIG. 1, the MEMS system 10 may further include electronics 16 and a non-metallic housing 22. The electronics 16 may include any type of electronics needed by the system. In preferred embodiments, the electronics 16 include signal conditioning electronics for the MEMS device 12.

The MEMS system 10 may also include a non-metallic housing 22. In some embodiments, the housing 22 may be made of ceramic. The housing 22 preferably couples to the substrate 14 on a first side 11 of the substrate 14 and encloses the MEMS device 12 and electronics 16, including the signal conditioning electronics, on the first side 11 of the ceramic substrate 12.

As may be seen in FIG. 1, the system 10 does not include a metal housing that surrounds the MEMS device 12 or the substrate 14 the MEMS device 12 is mounted to. Consequently, the metal port 20 is not formed in a metal housing that surrounds the ceramic substrate. Instead, the metal port 20 is mounted directly to the MEMS device 12 via the substrate 14.

Accordingly, in the embodiment shown in FIG. 1, the outside diameter of the metal port 20 is significantly smaller than the outside diameter of the substrate 14. In some embodiments, the outside diameter of the substrate 14 may be twice as big as the outside diameter of the metal port 20. In preferred embodiments, the outside diameter of the substrate 14 may be three times, four times, or even five times or more than the outside diameter of the metal port 20. There is no requirement that the port 20 and/or the substrate 14 be round and where either one is not round, an average distance across may be used to compare the relative size of the two instead of the outside diameter.

FIG. 3 illustrates an assembled view of the exploded view of the MEMS system 10 shown in FIG. 1. As may be seen in FIG. 3, the non-metallic housing 22 may include openings for connecting pins 24 to protrude outside the housing 22. This allows electrical communication with the MEMS system within the non-metallic housing 22 even when the system 10 is assembled as shown in FIG. 3.

Although the embodiments have been described with reference to preferred configurations and specific examples, it will readily be appreciated by those skilled in the art that many modifications and adaptations of the MEMS systems and methods for packaging MEMS devices described herein are possible without departure from the spirit and scope of the embodiments as claimed hereinafter. Thus, it is to be clearly understood that this description is made only by way of example and not as a limitation on the scope of the embodiments as claimed below.

What is claimed is:

1. A MEMS system comprising:
   a MEMS device including a front side and a backside;
   a ceramic substrate with an opening that traverses the ceramic substrate wherein the backside of the MEMS device is hermetically sealed to a first side of the ceramic substrate around the opening; and,
   a metal port aligned with the opening and hermetically sealed to the ceramic substrate around the opening on an opposite side of the ceramic substrate from the MEMS device;
   wherein the metal port is not formed in a metal housing that surrounds the ceramic substrate.

2. The MEMS system of claim 1, wherein the MEMS device is a pressure sensor.

3. The MEMS system of claim 1, wherein the pressure sensor includes a diaphragm exposed to the opposite side of the ceramic substrate through the opening.

4. The MEMS system of claim 1, wherein the metal port is a tube.

5. The MEMS system of claim 4, wherein the tube is copper.

6. The MEMS system of claim 1, further comprising a non-metallic housing that couples to the ceramic substrate on the first side of the ceramic substrate and encloses the MEMS device on the first side of the ceramic substrate.

7. The MEMS system of claim 6, wherein the non-metallic housing is made from ceramic.

8. The MEMS system of claim 1, further comprising signal conditioning circuitry for the MEMS device wherein the signal conditioning circuitry is mounted on the first side of the ceramic substrate.

9. The MEMS system of claim 6, wherein the non-metallic housing also encloses signal conditioning circuitry for the MEMS device mounted on the first side of the ceramic substrate.

10. The MEMS system of claim 1, further comprising a metallic layer deposited around the opening on the opposite side of the ceramic substrate between the ceramic substrate and the metal port and designed to allow the metal port to be soldered to the substrate.

11. A MEMS system comprising:
    a MEMS device including a front side and a backside;
    a ceramic substrate with an opening that traverses the ceramic substrate wherein the backside of the MEMS device is hermetically sealed to a first side of the ceramic substrate around the opening; and,
    a non-metallic housing that couples to the ceramic substrate on the first side and encloses the MEMS device on the first side of the ceramic substrate.

12. The MEMS system of claim 11, wherein the non-metallic housing is made from ceramic.

13. The MEMS system of claim 11, further comprising signal conditioning circuitry for the MEMS device wherein the signal conditioning circuitry is mounted on the first side of the ceramic substrate.

14. The MEMS system of claim 13, wherein the non-metallic using also encloses the signal conditioning circuitry.

15. The MEMS system of claim 11, further comprising a metal port aligned with the opening and hermetically sealed to the ceramic substrate around the opening on an opposite side of the ceramic substrate from the MEMS device.

16. The MEMS system of claim 15, wherein the port is not formed in a metal housing that surrounds the ceramic substrate.

17. A method of packaging a MEMS device comprising:
    hermetically sealing a MEMS device around an opening in a ceramic substrate on a first side of the ceramic substrate wherein a backside of the MEMS device is exposed to an opposite side of the ceramic substrate through the opening;
    mounting signal conditioning electronics for the MEMS device on the first side of the ceramic substrate;
    enclosing the MEMS device and signal conditioning electronics on the first side of the ceramic substrate with a non-metallic housing;
    depositing a layer of metallic paste around the opening on the opposite side of the ceramic substrate; and,
    hermetically sealing a metal port to the ceramic substrate by soldering the metal port to the metallic layer wherein the metal port is not formed as part of a metal housing that surrounds the ceramic substrate.

18. The method of claim 17, wherein the metal port is a metal tube with an outside diameter less than an outside diameter of the ceramic substrate.

19. The method of claim 18, wherein the metal tube is a copper tube.

20. The method of claim 17, wherein the depositing step is performed by screen printing the metallic paste around the opening.

21. A method of packaging a MEMS device comprising:
hermetically sealing a MEMS sensor around an opening in a ceramic substrate on a first side of the ceramic substrate wherein a backside of the MEMS device is exposed to an opposite side of the ceramic substrate through the opening;
hermetically sealing a metal tube to the opposite side of the ceramic substrate over the opening wherein the ceramic substrate has an outside diameter at least twice the outside diameter of the metal tube.

* * * * *